(12) United States Patent
Muthiah

(10) Patent No.: US 11,775,425 B2
(45) Date of Patent: Oct. 3, 2023

(54) STORAGE SYSTEM AND METHOD FOR ENABLING A SOFTWARE-DEFINED DYNAMIC STORAGE RESPONSE

(71) Applicant: Western Digital Technologies, Inc., San Jose, CA (US)

(72) Inventor: Ramanathan Muthiah, Bangalore (IN)

(73) Assignee: Western Digital Technologies, Inc., San Jose, CA (US)

(*) Notice: Subject to any disclaimer, the term of this patent is extended or adjusted under 35 U.S.C. 154(b) by 0 days.

(21) Appl. No.: 17/830,528

(22) Filed: Jun. 2, 2022

(65) Prior Publication Data

US 2022/0300412 A1 Sep. 22, 2022

Related U.S. Application Data

(62) Division of application No. 16/899,958, filed on Jun. 12, 2020, now Pat. No. 11,372,754.

(51) Int. Cl.
| | |
|---|---|
| *G06F 12/02* | (2006.01) |
| *G06F 3/06* | (2006.01) |
| *G06F 12/0815* | (2016.01) |
| *G06F 11/30* | (2006.01) |
| *G11C 11/408* | (2006.01) |
| *G06F 9/30* | (2018.01) |

(52) U.S. Cl.
CPC ........ *G06F 12/0246* (2013.01); *G06F 3/0611* (2013.01); *G06F 3/0644* (2013.01); *G06F 3/0679* (2013.01); *G06F 9/30047* (2013.01); *G06F 11/3037* (2013.01); *G06F 12/0292* (2013.01); *G06F 12/0815* (2013.01); *G11C 11/4085* (2013.01); *G06F 2212/7201* (2013.01)

(58) Field of Classification Search
None
See application file for complete search history.

(56) References Cited

U.S. PATENT DOCUMENTS

| | | | |
|---|---|---|---|
| 6,665,788 B1 | 12/2003 | Hughes | |
| 8,595,450 B2 | 11/2013 | Nguyen et al. | |
| 8,949,483 B1* | 2/2015 | Martin | G06F 3/0647 710/16 |
| 9,250,958 B2 | 2/2016 | Mark et al. | |
| 9,514,057 B2 | 12/2016 | Marcu et al. | |
| 10,712,949 B2 | 7/2020 | Hahn | |
| 2011/0246740 A1* | 10/2011 | Yata | G06F 3/0665 711/171 |

(Continued)

OTHER PUBLICATIONS

Peleato et al. "Towards Minimizing Read Time for NAND Flash." Dec. 2012. IEEE. GLOBECOM 2012. pp. 3219-3224.*

(Continued)

*Primary Examiner* — Nathan Sadler
(74) *Attorney, Agent, or Firm* — Crowell & Moring LLP

(57) ABSTRACT

A storage system and method for enabling a software-defined dynamic storage response are provided. In one embodiment, a controller of a storage system is configured to receive an expected response time from a host; in response to receiving the expected response time from the host, cache a logical-to-physical address table entry of a wordline; and store the cached logical-to-physical address table entry of the wordline as metadata in a next wordline along with host data. Other embodiments are provided.

20 Claims, 8 Drawing Sheets

(56) References Cited

U.S. PATENT DOCUMENTS

| | | | |
|---|---|---|---|
| 2013/0097118 A1* | 4/2013 | Jenkins | G06F 3/065 |
| | | | 707/634 |
| 2015/0149706 A1 | 5/2015 | Si | |
| 2016/0117252 A1 | 4/2016 | Thangaraj | |
| 2016/0246519 A1* | 8/2016 | McKean | G06F 3/0611 |
| 2016/0246530 A1* | 8/2016 | Mylavarapu | G06F 3/0688 |
| 2016/0283401 A1 | 9/2016 | Virajamangala | |
| 2016/0299711 A1* | 10/2016 | Bolik | G06F 3/0647 |
| 2017/0242584 A1 | 8/2017 | Zhang | |
| 2017/0329674 A1 | 11/2017 | Sreedhar et al. | |
| 2019/0138220 A1 | 5/2019 | Hahn | |
| 2020/0226038 A1 | 7/2020 | Peltz | |

OTHER PUBLICATIONS

U.S. Appl. No. 16/453,146, filed Jun. 26, 2019, entitled "Enabling Faster and Regulated Device Initialization Times."

\* cited by examiner

STORAGE SYSTEM AND METHOD FOR ENABLING A SOFTWARE-DEFINED DYNAMIC STORAGE RESPONSE

CROSS-REFERENCE TO RELATED APPLICATION

This application is a divisional of U.S. patent application Ser. No. 16/899,958, filed Jun. 12, 2020, which is hereby incorporated by reference.

BACKGROUND

A host can send write and read commands to a storage system to store data in or read data from a memory in the storage system. The amount of time needed for the storage system to respond to a command from the host is referred to as response latency. The host can be made aware of the response latency of the storage system, so it will know what type of use cases would be appropriate given the response latency.

DETAILED DESCRIPTION

Overview

Figure 1A:
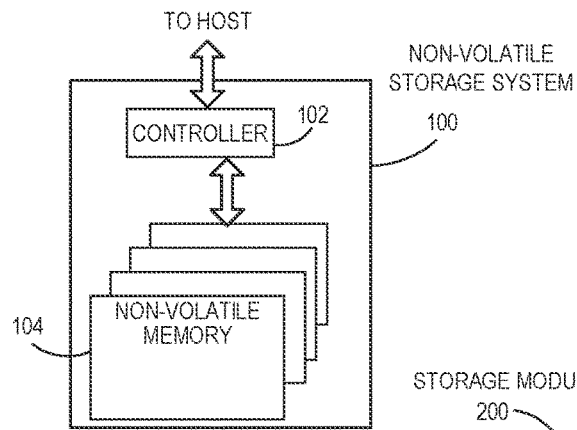
FIG. 1A is a block diagram of a non-volatile storage system of an embodiment.

By way of introduction, the below embodiments relate to a storage system and method for enabling a software-defined dynamic storage response. In one embodiment, a method is provided that is performed in a host in communication with a plurality of pools of storage systems. The method comprises establishing a response time for each pool of storage systems, wherein each pool is associated with a different response time; determining a host responsiveness requirement; and determining which one of the plurality of pools of storage systems has a response time capable of meeting the host responsiveness requirement.

In some embodiments, the method further comprises requesting that each storage system provide its response time to the host.

In some embodiments, the method further comprises requesting that a storage system change its response time.

In some embodiments, the method further comprises requesting that a storage system change its flush frequency to ensure the host responsiveness requirement is met.

In some embodiments, the flush frequency relates to a flush of one or more of the following: an initialization overhead flush, a master table flush, and a built parity flush.

In some embodiments, the flush frequency is also changed based on one or more of the following: memory block type, number of open memory blocks, and health of a memory block.

In another embodiment, a storage system is provided comprising a memory and a controller. The controller is configured to receive an expected response time from a host; in response to receiving the expected response time from the host, cache a logical-to-physical address table entry of a wordline; and store the cached logical-to-physical address table entry of the wordline as metadata in a next wordline along with host data.

In some embodiments, the expected response time is less than an initialization time of the storage system.

In some embodiments, the controller is further configured to cache a portion of logical-to-physical address table entries of a wordline by storing them in a subsequent wordline alongside flash management units.

In some embodiments, the cached logical-to-physical address table entry is stored as a header.

In some embodiments, the controller is further configured to alter a frequency of a flush in the storage system to ensure the expected response time is met.

In some embodiments, the flush comprises one or more of the following: an initialization overhead flush, a master table flush, and a built parity flush.

In some embodiments, the controller is further configured to alter the frequency of the flush based on one or more of the following: memory block type, number of open memory blocks, and health of a memory block.

In some embodiments, the memory comprises a three-dimensional memory.

In another embodiment, a storage system is provided comprising a memory; means for receiving an expected response time from a host; means for in response to receiving the expected response time from the host, caching a logical-to-physical address table entry of a wordline; and means for storing the cached logical-to-physical address table entry of the wordline as metadata in a next wordline along with host data.

In some embodiments, the expected response time is less than an initialization time of the storage system.

In some embodiments, the cached logical-to-physical address table entry is stored as a header.

In some embodiments, the storage system further comprises means for altering a frequency of a flush in the storage system to ensure the expected response time is met.

In some embodiments, the flush comprises one or more of the following: an initialization overhead flush, a master table flush, and a built parity flush.

In some embodiments, the storage system further comprises means for altering the frequency of the flush based on one or more of the following: memory block type, number of open memory blocks, and health of a memory block.

In some embodiments, the memory comprises a three-dimensional memory.

Other embodiments are possible, and each of the embodiments can be used alone or together in combination. Accord-

Embodiments

Figure 1B:
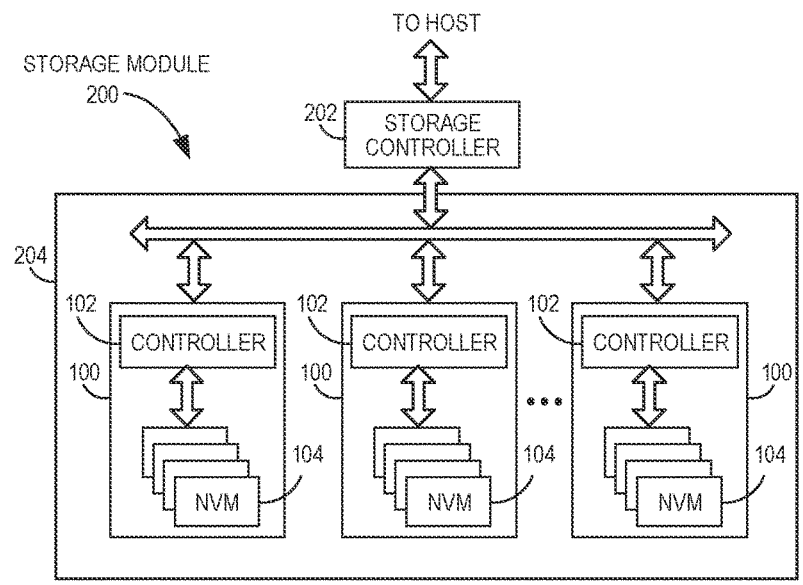
FIG. 1B is a block diagram illustrating a storage module of an embodiment.
Figure 1C:
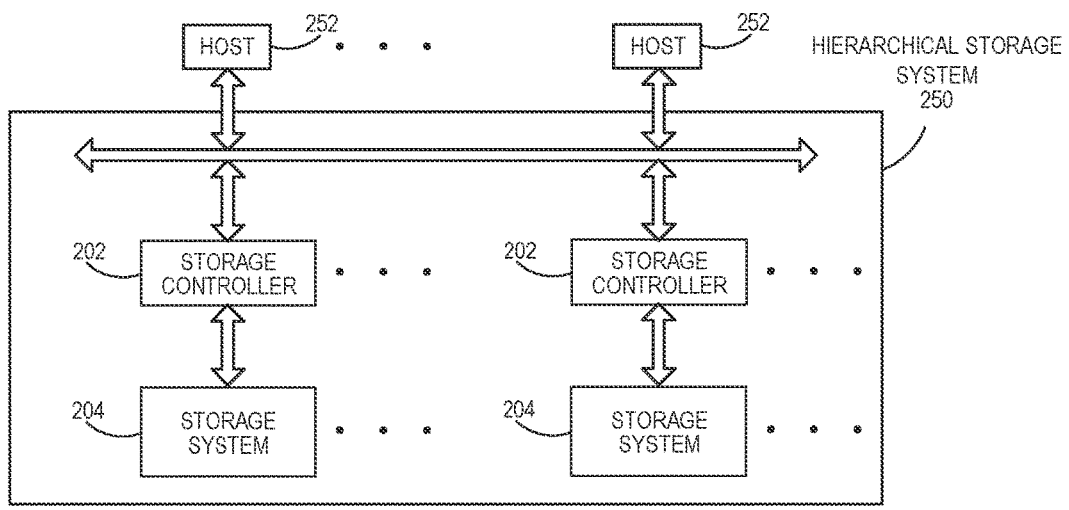
FIG. 1C is a block diagram illustrating a hierarchical storage system of an embodiment.

Storage systems suitable for use in implementing aspects of these embodiments are shown in FIGS. 1A-1C. FIG. 1A is a block diagram illustrating a non-volatile storage system 100 according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magnetoresistive random-access memory (MRAM) controller)) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including resistive random-access memory (ReRAM), magnetoresistive random-access memory (MRAM), phase-change memory (PCM), NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some storage system architectures (such as the ones shown in FIGS. 1B and 1C), 2, 4, 8 or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), peripheral component interconnect express (PCIe) interface, or double-data-rate (DDR) interface. Storage module 200, in one embodiment, may be a solid state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a Non-Volatile Memory Express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
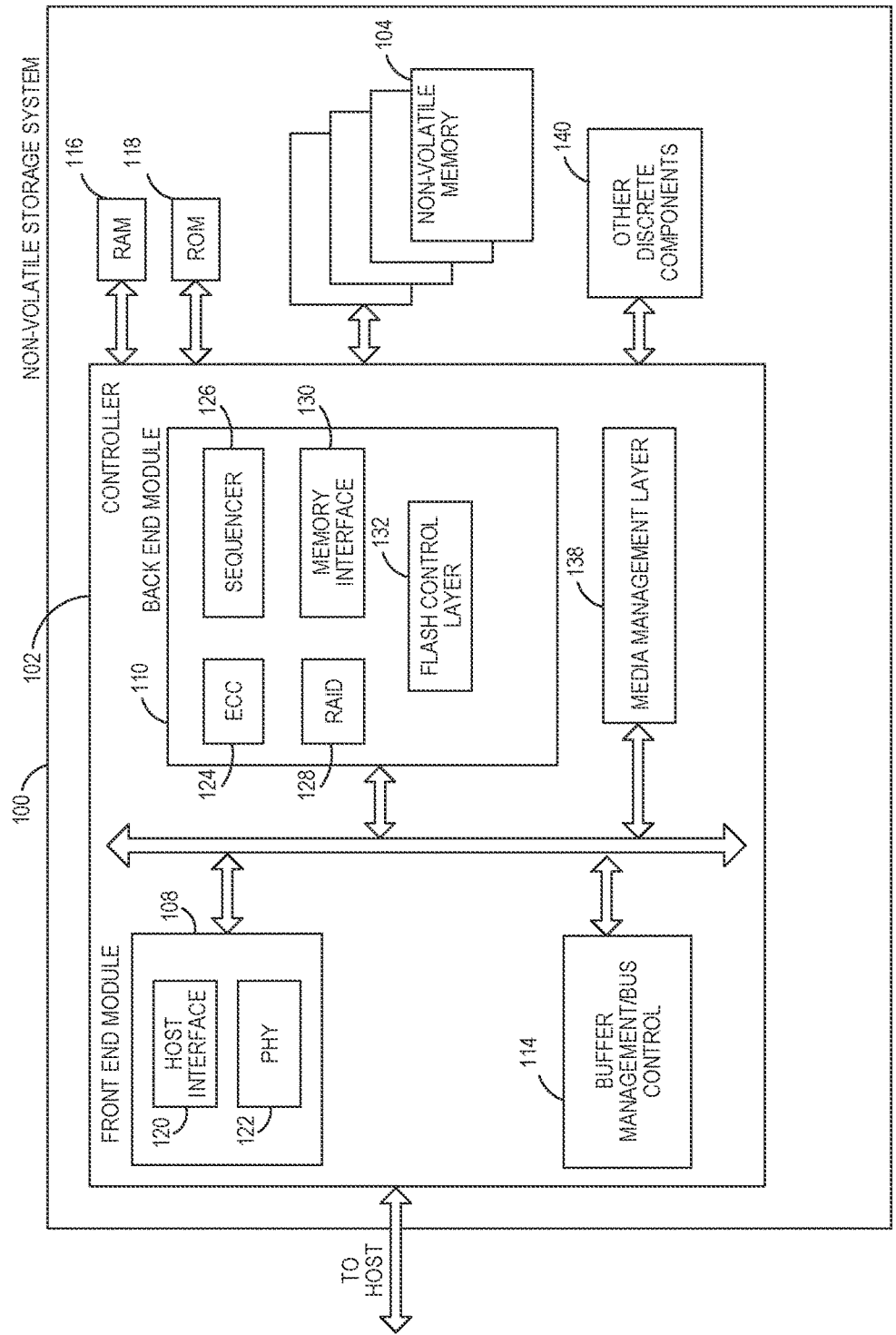
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
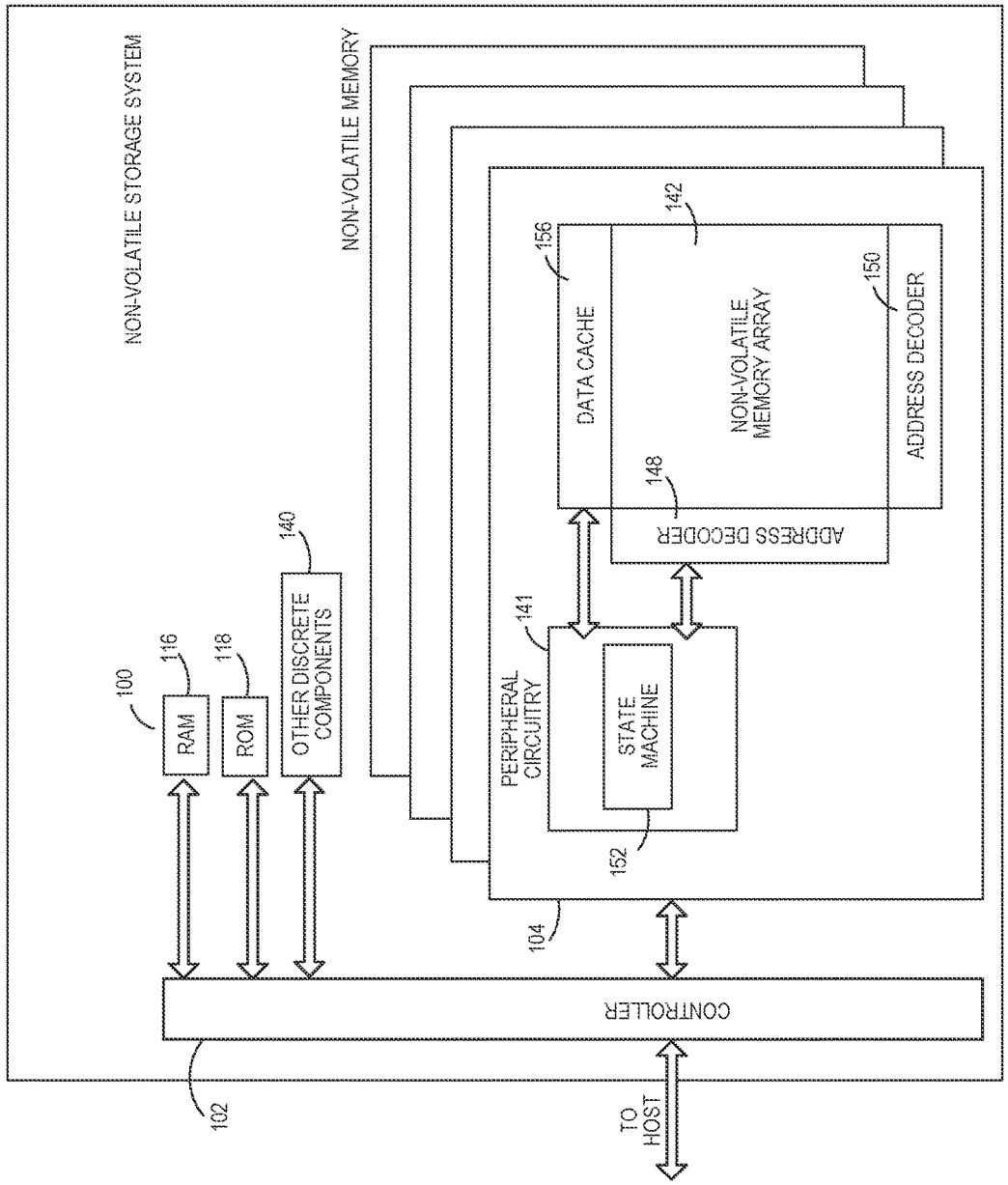
FIG. 2B is a block diagram illustrating components of the non-volatile memory storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two dimensional and/or three dimensional configuration. Non-volatile memory die 104 further includes a data cache 156 that caches data and address decoders 148, 150. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may only be written in multiples of pages, and/or may not be written unless it is erased as a block. The FTL understands these potential limitations of the memory 104, which may not be visible to the host. Accordingly, the FTL attempts to translate the writes from host into writes into the memory 104.

The FTL may include a logical-to-physical address (L2P) map and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

Figure 3:
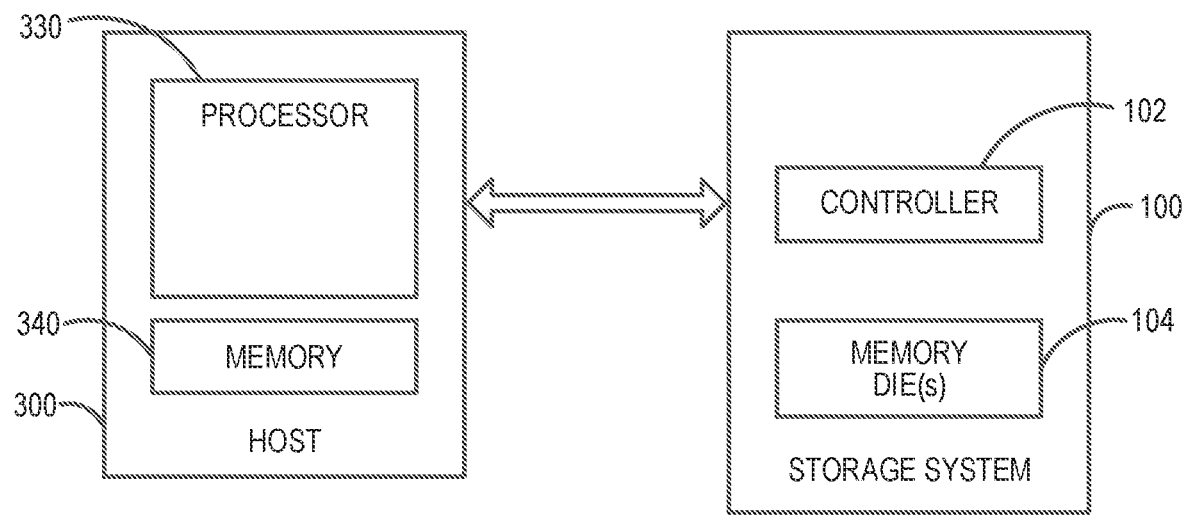
FIG. 3 is a block diagram of a host and storage system of an embodiment.

Turning again to the drawings, FIG. 3 is a block diagram of a host 300 and storage system (sometimes referred to herein as a "device") 100 of an embodiment. The host 300 can take any suitable form, including, but not limited to, a computer, a mobile phone, a tablet, a wearable device, a digital video recorder, a surveillance system, etc. The host 300 in this embodiment (here, a computing device) comprises a processor 330 and a memory 340. In one embodiment, computer-readable program code stored in the host memory 340 configures the host processor 330 to read data from and write data to the storage system 100, as well as perform at least the functions described herein 100.

As mentioned above, the amount of time needed for the storage system (sometimes referred to herein as a "device") 100 to respond to a command from the host 300 is referred to as response latency. The host 300 can be made aware of the response latency of the storage system 100, so it will know what type of use cases would be appropriate given the response latency. For example, users expect applications on a mobile device to be responsive and fast to load. An application ("app") with a slow start time does not meet this expectation and can be disappointing to users. Many such applications could load from and access the memory 104 directly.

The main issue is the "unavailable guaranteed response" during storage system 100/memory (Flash) 104 initialization for a latency less than a predetermined threshold. While flash devices do initialize faster than their hard-disk counterparts, the initialization latency varies and depends a lot on the way the storage system was previously shut down and can be based on its internal firmware state. Due to this varied wide range (e.g., as wide as a few milliseconds to 10-20 seconds) to initialize, a host typically does not have control over the storage system to direct or tune it to suit a use case. Without a guaranteed response time, the host may not be confident to use the storage system for applications such as Online Transaction Processing (OLTP) applications, which can require an acknowledgement in a few milliseconds.

The following embodiments can be used to address these issues. In one embodiment, the host 300 is connected to a pool of storage systems, and a specification allows the host 300 to control the responsiveness of a storage system during initialization. In one example implementation, the controller of each of the storage systems in the pool is configured to enable faster and regulated device initialization time using the techniques described in U.S. patent application Ser. No.

16/453,146, which is hereby incorporated by reference. Of course, this is just one example, and other implementations can be used.

Figure 4:
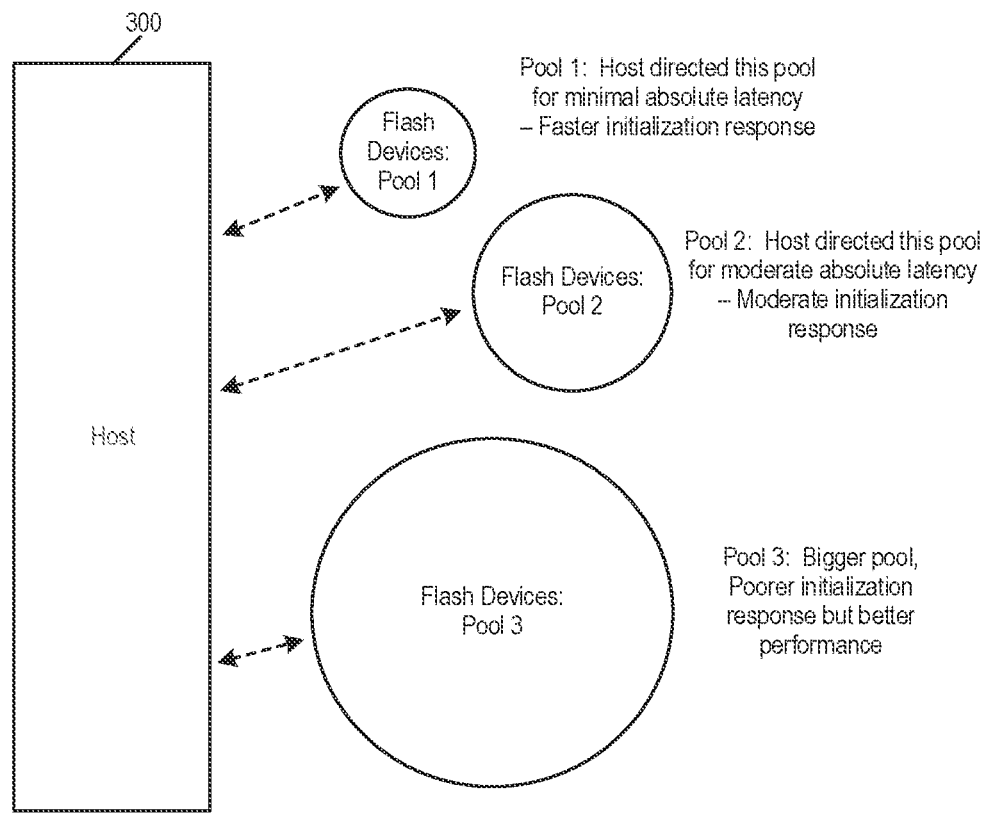
FIG. 4 is an illustration of a host and a plurality of pools of an embodiment.

In one embodiment, the controller 102 of the storage system 100 internally tweaks its storage logic to accommodate a dynamic host directive of a defined latency (or less, but not more) for device initialization, irrespective of its state or the last shut-down mode. This is illustrated in FIG. 4. As shown in FIG. 4, the host 300 is in communication with a plurality (here, there) pools of storage systems. In Pool 1, the host 300 directs the storage systems in that pool for minimal absolute latency, which provides fast initialization response time. In Pool 2, the host 300 directs the storage systems in that pool for moderate absolute latency, which provides a moderate initialization response time. Pool 3 is bigger that Pools 1 and 2 and provides a poorer initialization response but better performance. As can be seen by these examples, a smaller pool provides a quicker response at the cost of performance. Because the faster initialization response comes at a performance cost, the host 300 may only want to allocate a fewer number of storage systems to the quicker response pool based on need. Such a mechanism enables the host 300 to deal with applications, such as Online Transaction Processing (OLTP) applications, that need a guaranteed quick acknowledgement, even if all the devices in the pools have gone to a deep power-down mode needing a cold start.

Based on the supported applications and their response requirement, the host 300 can dynamically decide on the optimum response time and communicate to the appropriate storage pool during command execution. Storage systems that exhibit intensive flash read activity and systems under heavy main memory pressure that rely on the flash system for bare minimum initialization can leverage such a mechanism. Guaranteed software-defined initialization also indirectly means power optimization through better deep power-down protocols since it enables the option of frequent device shut downs.

To accommodate the host directive, the controller 102 in the storage system 100 can cache the logical-to-physical address table entries of one or more wordlines and store them as metadata along with the host data. This way, the fragment (or the flash management unit (FMU)) comprising the header (the metadata) of the blocks can be scanned quickly rather than accessing each and every FMU. The initialization overhead data in the form of a storage fragment is a condensed version of all the headers (containing logical address information of the stored fragment) of one or multiple wordlines stored previously. That is, the logical-to-physical address mapping of all flash management units (FMUs) of a wordline can be cached and stored in the next or subsequent wordline based on absolute latency defined by the host 300 as an "initialization overhead" along with the host data writes in a separate flash management unit. The controller 102 can also determine the frequency of initialization overhead flush, the frequency of a master table flush, and the frequency of a built parity flush based on the host-defined absolute latency. Other parameters, such as NAND block type, number of open blocks and health, can play a role in dynamically adjusting the frequency of flushes, which itself is in accordance with the host-defined latency.

Designing a guaranteed flash initialization response for a predetermined absolute time enables the host 300 to pool storage systems into fast and slow response device pools when the need arises. This can be a way of differentiating the storage pools among other traditional factors, such as performance and endurance. The initialization overhead data in the form of a storage fragment is a condensed version of all the headers of one or multiple wordlines stored previously. So, effectively, scanning the entire header converges to just one overhead scanning. Such a mechanism allows the flash to perform a quick replay the next time, importantly guaranteeing latency for a given configuration, even if it means an abrupt power down of the storage system. Such a guarantee comes with the cost of performance degradation due to overhead storage along with host data and increased write amplification.

Figure 5:
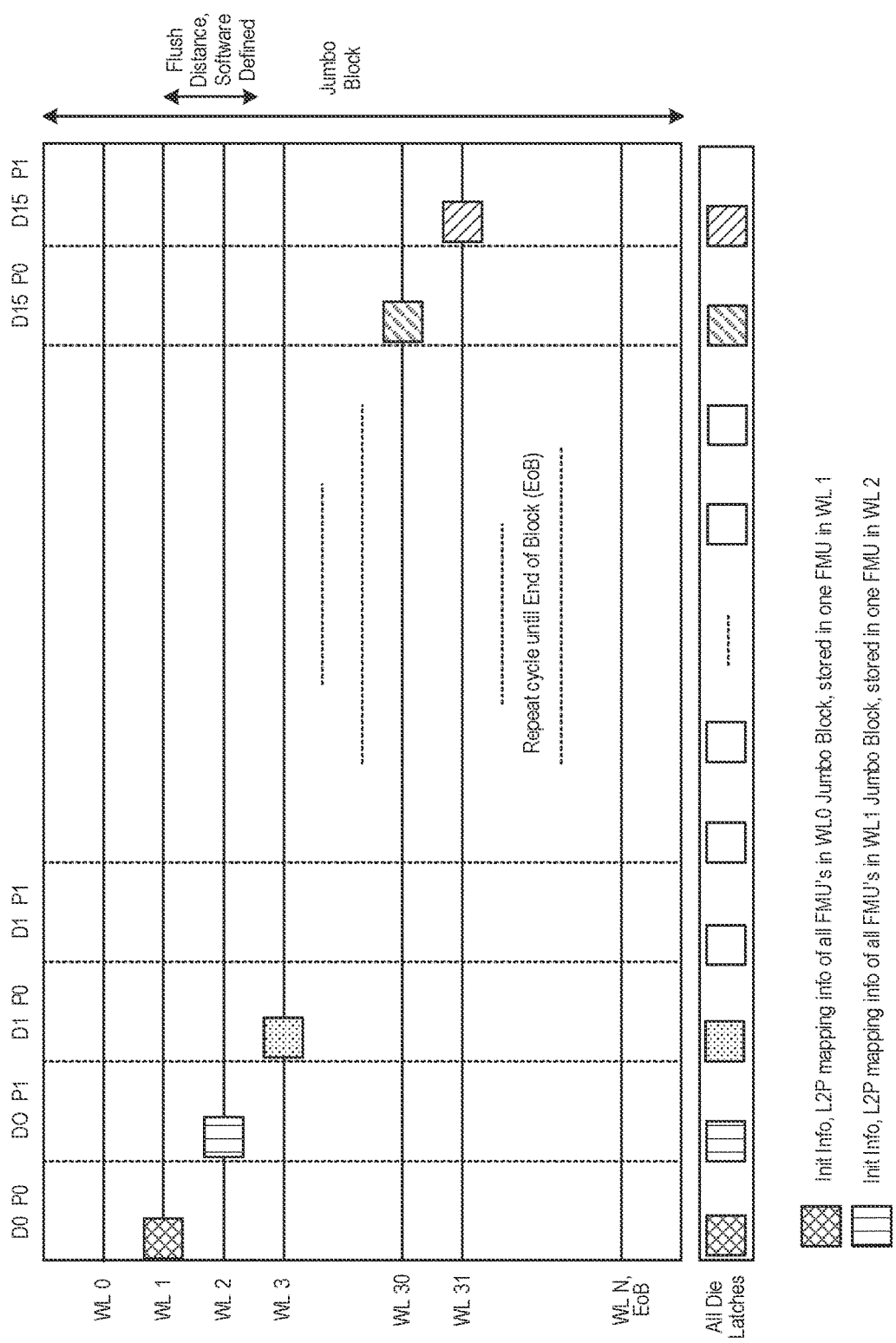
FIG. 5 is an illustration of a memory design of an embodiment for providing a fast response directive from a host.

This is illustrated in the graph shown in FIG. 5. The host 300 can take a dynamic call on how big or small the quick response pool would be to ensure that the disadvantages do not dampen the value proposition. In FIG. 5, the "flush distance" refers to a factor in replaying latency during initialization and, hence, can be modified according to the host-defined response time. Keeping a short flush distance can enable the flash to quickly respond but at the cost of performance and write amplification. Such tuning can be part of the system's design.

A common performance measurement of a clustered storage is the amount of time required to satisfy client requests. In conventional systems, this time consists of a disk-access time and an amount of central processing unit (CPU) processing time based on the current state or from the state it is mounting. The method described herein may be able to improve responsiveness of client-initiated data requests towards data stored in a clustered storage environment.

In another embodiment, the host 300 can request the device 100 share its access time, and the device 100 can provide its access time. The host 300 can suggest the device 100 change its access time as well. Typically, the master table and the parity bins are periodically flushed in the flash 104 to make sure the sequence is replayed quickly. In one embodiment, the frequency of the master flush can be done based on the host-defined absolute latency. In the same manner, the parity bins, which are flushed, can also be based on a frequency, which is consistent with the latency allowed by the host 300 for initialization. If the number of open blocks is high, then the latency to replay the events can potentially increase, hence ensuring that the defined initialization latency is met. Other frequencies of flushes are tuned accordingly (e.g., frequency can be increased). Similarly, if the health of the flash is poor in the open blocks, which is a potential risk in latency while replaying during initialization, the parameter can be accommodated as a tuning factor.

Figure 6:
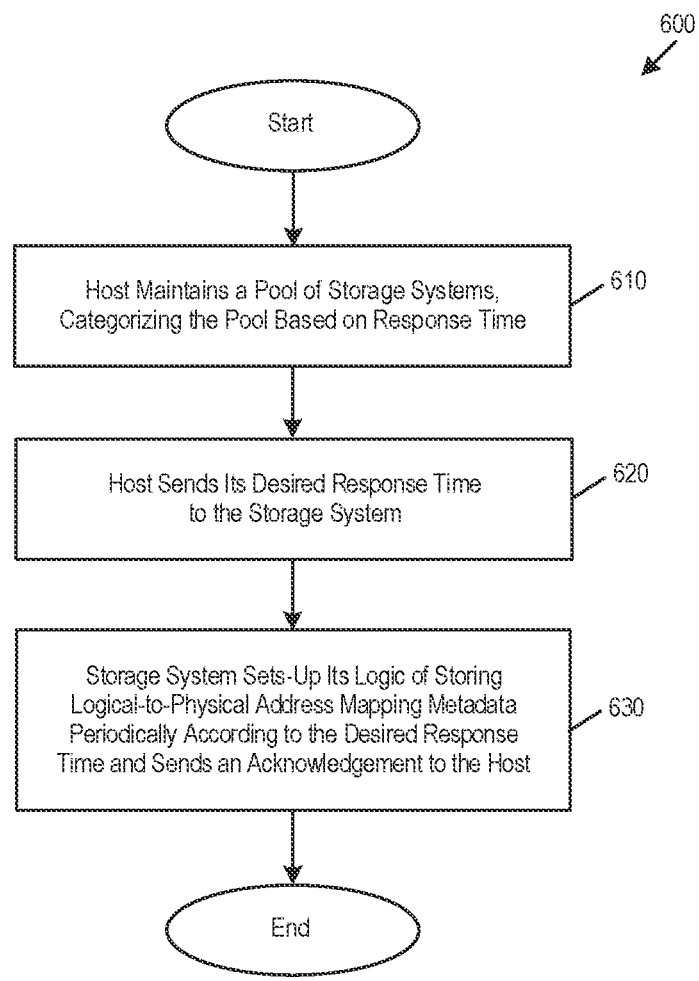
FIG. 6 is a flow chart of a method of an embodiment for setting up pools of storage systems.

Turning again to the drawings, FIG. 6 is a flow chart 600 of a method of an embodiment for setting up pools of storage systems. As shown in FIG. 6, in this method, the host 300 maintains a pool of storage systems, categorizing the pool based on response time (act 610). The host 300 then sends its desired response time to the storage system 100 (act 620). The storage system 100 sets-up its logic of storing logical-to-physical address mapping metadata periodically according to the desired response time and sends an acknowledgement to the host 300 (act 630).

Figure 7:
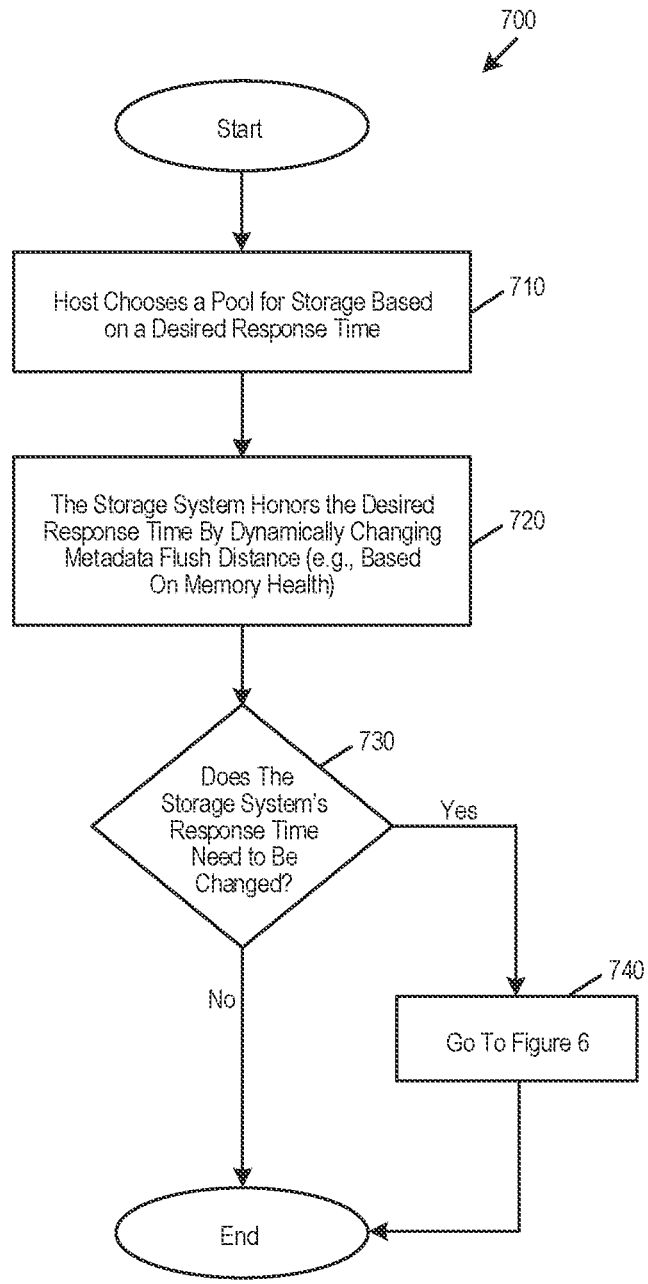
FIG. 7 is a flow chart of a method of an embodiment for using pools of storage systems.

FIG. 7 is a flow chart 700 of a method of an embodiment for using pools of storage systems. As shown in FIG. 7, the host 300 chooses a pool for storage based on a desired response time (act 710). The storage system 100 honors the desired response time by dynamically changing metadata flush distance (e.g., based on memory health) (act 720). Next, it is determined if the storage system's response time needs to be changed (act 730). If it does, the method of FIG. 5 is used (act 740).

There are several advantages associated with these embodiments. For example, the host 300 gets to dynamically define the response times for the storage pools based on need. Based on the different applications being supported, the host 300 can modify the pool size accordingly. The system can also be tuned to maintain a ranged initialization latency even for different product configurations based on various parameters, such as health of a block, pattern of data, type of a block (e.g., single level cell (SLC) or triple level cell (TLC)), and number of open blocks.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A method comprising:
performing the following in a host in communication with a plurality of pools of storage systems:
establishing a response time for each pool of storage systems, wherein each pool is associated with a different response time;
determining a host responsiveness requirement;
determining which pool of the plurality of pools of storage systems has a response time capable of meeting the host responsiveness requirement; and
sending host data and the host responsiveness requirement to the determined pool;
wherein a storage system in the determined pool is configured to store a cached logical-to-physical address table entry of a wordline in its memory as metadata in a next wordline along with the host data.

2. The method of claim 1, further comprising requesting that each storage system in the plurality of pools provide its response time to the host.

3. The method of claim 1, further comprising requesting that the storage system change its response time.

4. The method of claim 1, further comprising requesting that the storage system change its flush frequency to ensure that the host responsiveness requirement is met.

5. The method of claim 4, wherein the flush frequency relates to an initialization overhead flush.

6. The method of claim 4, wherein the flush frequency relates to a master table flush.

7. The method of claim 4, wherein the flush frequency relates to built parity flush.

8. The method of claim 4, wherein the flush frequency relates to a memory block type.

9. The method of claim 4, wherein the flush frequency relates to a number of open memory blocks.

10. The method of claim 4, wherein the flush frequency relates to a health of a memory block.

11. A host comprising:
a memory; and
a processor configured to communicate with the memory and further configured to:
communicate with a plurality of pools of storage systems;
establish a response time for each pool of storage systems, wherein each pool is associated with a different response time;
determine a host responsiveness requirement;
determine which pool of the plurality of pools of storage systems has a response time capable of meeting the host responsiveness requirement; and
send host data and the host responsiveness requirement to the determined pool;
wherein a storage system in the determined pool is configured to store a cached logical-to-physical address table entry of a wordline in its memory as metadata in a next wordline along with the host data.

12. The host of claim 11, wherein the processor is further configured to request that each storage system in the plurality of pools provide its response time to the host.

13. The host of claim 11, wherein the processor is further configured to request that the storage system change its response time.

14. The host of claim 11, wherein the processor is further configured to request that the storage system change its flush frequency to ensure that the host responsiveness requirement is met.

15. The host of claim 14, wherein the flush frequency relates to an initialization overhead flush.

16. The host of claim 14, wherein the flush frequency relates to a master table flush.

17. The host of claim 14, wherein the flush frequency relates to a built parity flush.

18. The host of claim 14, wherein the flush frequency relates to a memory block type.

19. The host of claim 14, wherein the flush frequency relates to a number of open memory blocks or a health of a memory block.

20. A host comprising:
means for communicating with a plurality of pools of storage systems;
means for establishing a response time for each pool of storage systems, wherein each pool is associated with a different response time;
means for determining a host responsiveness requirement;
means for determining which pool of the plurality of pools of storage systems has a response time capable of meeting the host responsiveness requirement; and
means for sending host data and the host responsiveness requirement to the determined pool;
wherein a storage system in the determined pool is configured to store a cached logical-to-physical address table entry of a wordline in its memory as metadata in a next wordline along with the host data.

* * * * *